(12) United States Patent
Narasimhan et al.

(10) Patent No.: US 8,066,840 B2
(45) Date of Patent: Nov. 29, 2011

(54) FINGER PATTERN FORMATION FOR THIN FILM SOLAR CELLS

(75) Inventors: Mukundan Narasimhan, San Jose, CA (US); Todd Johnson, San Jose, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 620 days.

(21) Appl. No.: 12/018,114

(22) Filed: Jan. 22, 2008

(65) Prior Publication Data
US 2008/0173390 A1    Jul. 24, 2008

Related U.S. Application Data

(60) Provisional application No. 60/886,078, filed on Jan. 22, 2007.

(51) Int. Cl.
B29C 65/00 (2006.01)
B32B 37/00 (2006.01)

(52) U.S. Cl. ........... 156/251; 156/261; 438/98; 136/256

(58) Field of Classification Search .................. 156/233, 156/251, 256, 261; 438/98; 136/256
See application file for complete search history.

(56) References Cited

U.S. PATENT DOCUMENTS

| | | | |
|---|---|---|---|
| 3,492,167 A * | 1/1970 | Nobuo et al. | 136/260 |
| 4,165,241 A | 8/1979 | Yerkes et al. | |
| 4,400,409 A * | 8/1983 | Izu et al. | 438/62 |
| 4,517,739 A * | 5/1985 | Lenaerts et al. | 29/846 |
| 4,518,815 A | 5/1985 | Yamazaki | |
| 4,586,988 A | 5/1986 | Nath et al. | |
| 4,623,688 A * | 11/1986 | Flanagan | 524/377 |
| 4,680,422 A * | 7/1987 | Stanbery | 136/249 |
| 4,695,674 A * | 9/1987 | Bar-on | 136/256 |
| 4,697,041 A | 9/1987 | Okaniwa | |
| 4,751,149 A * | 6/1988 | Vijayakumar et al. | 428/702 |
| 5,447,824 A | 9/1995 | Mutsaers et al. | |
| 5,453,134 A | 9/1995 | Arai et al. | |
| 5,504,133 A * | 4/1996 | Murouchi et al. | 524/430 |
| 5,688,366 A * | 11/1997 | Ichinose et al. | 438/754 |
| 5,980,679 A * | 11/1999 | Severin et al. | 156/233 |
| 6,444,400 B1 | 9/2002 | Cloots et al. | |
| 6,444,899 B2 | 9/2002 | Kubota | |
| 7,026,079 B2 | 4/2006 | Louwet et al. | |
| 7,276,658 B2 | 10/2007 | Dubbeldam | |
| 2005/0202589 A1* | 9/2005 | Basol | 438/102 |

FOREIGN PATENT DOCUMENTS

JP 03131679 A * 6/1991

* cited by examiner

*Primary Examiner* — John Goff, II
(74) *Attorney, Agent, or Firm* — Pillsbury Winthrop Shaw Pittman LLP

(57) ABSTRACT

A method of forming metallic connector patterns for solar cells, whereby an embosser having raised features shaped in the form of a metallic connector pattern is used to attach a portion of a metallic foil to a transparent conductive layer formed on a top transparent surface of a solar cell structure. The raised surfaces of the embosser press the metallic foil portion against the transparent conductive layer. Heat and pressure directed to the metallic foil portion attach the metallic foil portion to the underlying transparent conductive layer, and then the rest of the metallic foil, which is not attached to the transparent conductive layer, is removed.

9 Claims, 11 Drawing Sheets

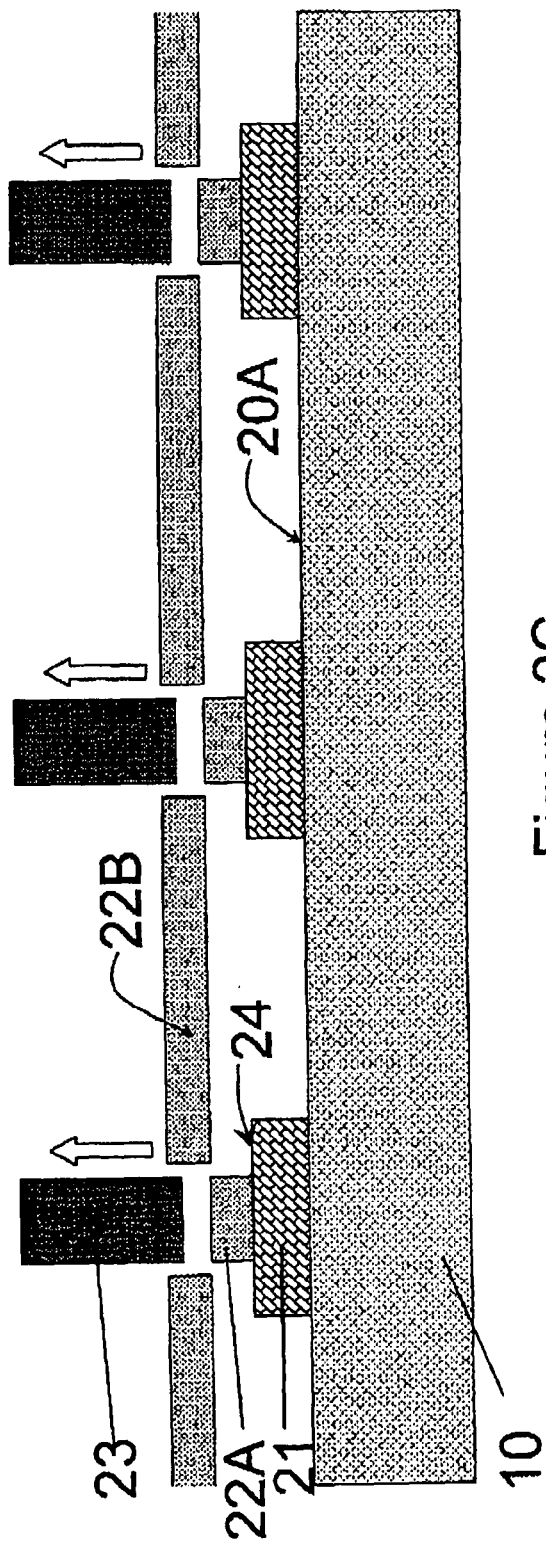

US 8,066,840 B2

FINGER PATTERN FORMATION FOR THIN FILM SOLAR CELLS

The present application claims priority from U.S. Provisional Appln. No. 60/886,078 filed Jan. 22, 2007, the contents of which are incorporated herein by reference in their entirety.

BACKGROUND

Field

The present invention relates to a method and system for manufacturing thin film solar cells.

DESCRIPTION OF THE RELATED ART

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods. Group IIB-VIA compounds such as CdTe, Group IBIIIAVIA compounds and amorphous Group IVA materials such as amorphous Si and amorphous Si alloys are important thin film materials that are being developed.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(SySe_{1-y})_k$, where $0 \leq x \leq 1$, $0 \leq y \leq 1$ and k is approximately 2, have already been employed in solar cell structures that yielded conversion efficiencies approaching 20%. Among the family of compounds, best efficiencies have been obtained for those containing both Ga and In, with a Ga amount in the 15-25%. Recently absorbers comprising Al have also been developed and high efficiency solar cells have been demonstrated using such absorbers.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical ohmic contact to the device. The substrate 11 and the conductive layer 13 form a base 16 on which the active layers of the device are deposited. The most commonly used contact layer or conductive layer in the solar cell structure of FIG. 1 is Molybdenum (Mo). If the substrate itself is a properly selected conductive material such as a Mo foil, it is possible not to use a conductive layer 13, since the substrate 11 may then be used as the ohmic contact to the device. The conductive layer 13 may also act as a diffusion barrier in case the metallic foil is reactive. For example, foils comprising materials such as Al, Ni, Cu may be used as substrates provided a barrier such as a Mo layer is deposited on them protecting them from Se or S vapors. The barrier is often deposited on both sides of the foil to protect it well. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

Thin film photovoltaic devices may be manufactured in the form of monolithically integrated modules where electrical interconnection of individual solar cells with each other is achieved on a single substrate, such as a glass sheet, during the film deposition steps and a module with high voltage is obtained. Alternatively thin film solar cells may be manufactured individually as separate cells and then connected in series, through use of metallic ribbons, soldering or conductive epoxies, like crystalline Si solar cells, to obtain high voltage modules. In this case, solar cells often need to be large area, one dimension being greater than 1", typically greater than 3". Such large area requires deposition of finger patterns over the top conducting layer of the solar cell, such as the transparent layer 14 in FIG. 1.

The finger patterns comprising at least one busbar and multiple fingers connecting to the busbar are generally formed by screen-printing a conductive ink typically a silver-based ink followed by a curing step to get rid of the solvent and to conjoin the silver particles together to the optimal packing density. The screen-printing technique has limitations in terms of its ability to produce narrow fingers. Typically the line width of a screen printed finger needs to be greater than 100 micrometers (μm) to obtain a continuous line. Such large finger widths dramatically increase the shadowing loss in solar cells. The curing temperature of the inks used for Si solar cell manufacturing is typically greater than 200° C. This temperature may need to be reduced to below 200° C. for thin film solar cells such as CIGS solar cells due to possible degradation problems with annealing at elevated temperatures. Although, at the present time many of the available inks require high temperatures to cure (such as greater than 200° C.) there are some low temperature curable inks available that typically cure at less than 150° C. Once cured, the inks themselves have conductivities that are 10-20 times the bulk material. For example a typical Ag-based ink when cured at it's appropriate curing temperature gives a bulk resistivity of about 20-40 micro-ohm-cm (μΩcm). Such high bulk resistivity causes high resistive loses along the fingers and the busbar during operation of the solar cell. A total power loss in a typical screen printed finger pattern comprising fingers and one or two busbars amounts to about 15-20% of the gross power generated by the solar cell. Out of this total, the finger resistive losses are typically 5-6%, the finger shadowing losses add up to about 6-7%, the busbar shadow losses amount to around 3% and the busbar resistive losses are typically less than 1% with an addition of a ribbon material, typically Sn-plated Cu, which is soldered on top of the busbar to enhance its effective conductivity.

As can be seen from the brief discussion above there is a need to develop new approaches for the formation of low resistance finger patterns on solar cells, at the same time keeping the shadow losses to a minimum.

SUMMARY

A method of forming metallic connector patterns for solar cells, whereby an embosser having raised features shaped in the form of the metallic connector pattern is used to attach a portion of a metallic foil to a transparent conductive layer formed on a top transparent surface of a solar cell structure. The raised surfaces of the embosser press the metallic foil portion against the transparent conductive layer. Heat and pressure directed to the metallic foil portion attaches this portion to the underlying transparent conductive layer, and then the rest of the metallic foil is removed.

BRIEF DESCRIPTION OF THE DRAWINGS

FIG. 2C shows the transfer of a finger pattern on a device structure.

DETAILED DESCRIPTION

In one embodiment, the present invention forms a highly conductive metallic foil finger pattern on a solar cell structure without causing excessive shadow loss. This is achieved by transferring a highly conductive metal foil on the surface of the solar cell in the form of a finger pattern and employing a transparent conductive layer which has adhesive characteristics to attach the finger pattern on the solar cell surface. The transparent conductive layer is substantially transparent in a wavelength range of 0.45-1.2 micrometers, having an optical transmission of more than about 70%. The method will now be discussed by describing a method of forming a finger pattern or grid pattern on the device 10 which is shown in detail in FIG. 1.

Figure 1:
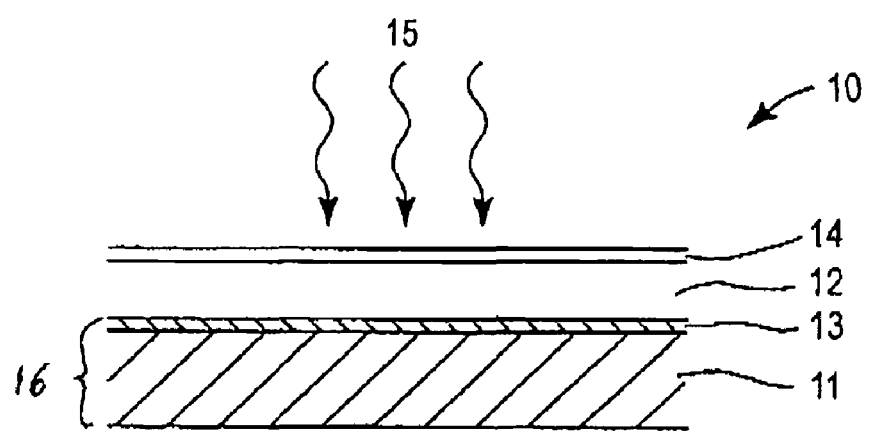
FIG. 1 is the structure of a conventional Group IBIIIAVIA compound photovoltaic cell.
Figure 2A:
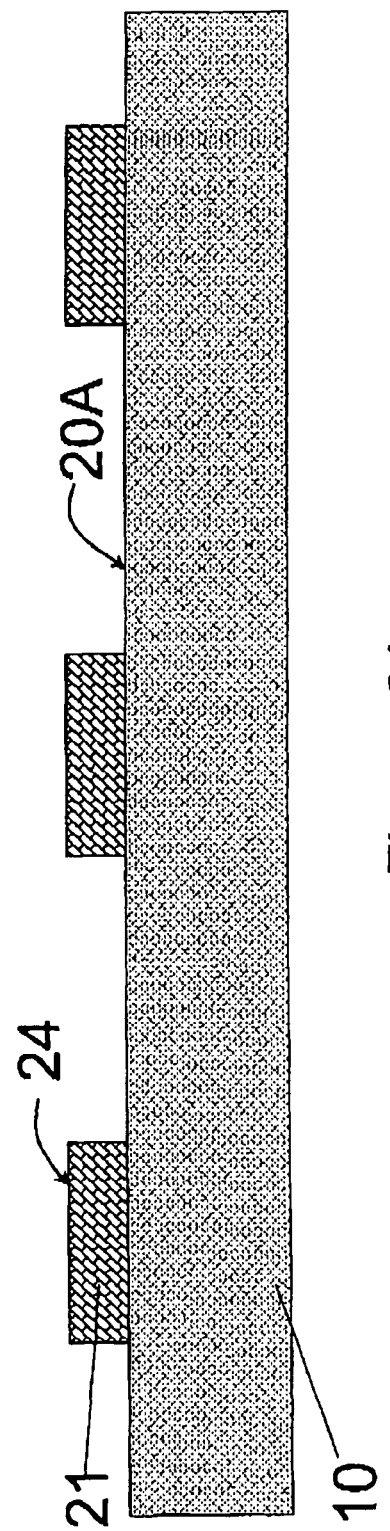
FIG. 2A shows a step of depositing a transparent conductive material in a patterned manner on the top surface of a device.

Referring to FIG. 2A, the device 10 (details of the device are shown in FIG. 1) on which the finger pattern will be formed may comprise a transparent material at its top surface 20A. As described before in reference to FIG. 1, the top surface 20A may comprise any of the commonly known materials that are deposited on p-type CIGS(S) layers or p-CIGS(S)/buffer layer structures to form solar cells. These transparent materials include, but are not limited to CdS, CdZnS, indium-tin-oxide (ITO), tin-oxide (TO), zinc-oxide (ZnO), indium-zinc-oxide (IZO), or the like. The buffer layers include, but are not limited to CdS, ZnS, CdZnS, ZnSe, (Ga,In)—(S,Se), In—S—O, or the like.

In forming the finger pattern over the top surface 20A of the device 10, a transparent conductive material 21 is first deposited in a patterned manner onto the top surface 20A. The pattern of the transparent conductive material 21 may substantially match the pattern of, at least, the fingers to be formed. Further, the pattern of the transparent conductive material 21 may preferably match the pattern of the busbar to be formed on the top surface 20A.

Figure 2B:
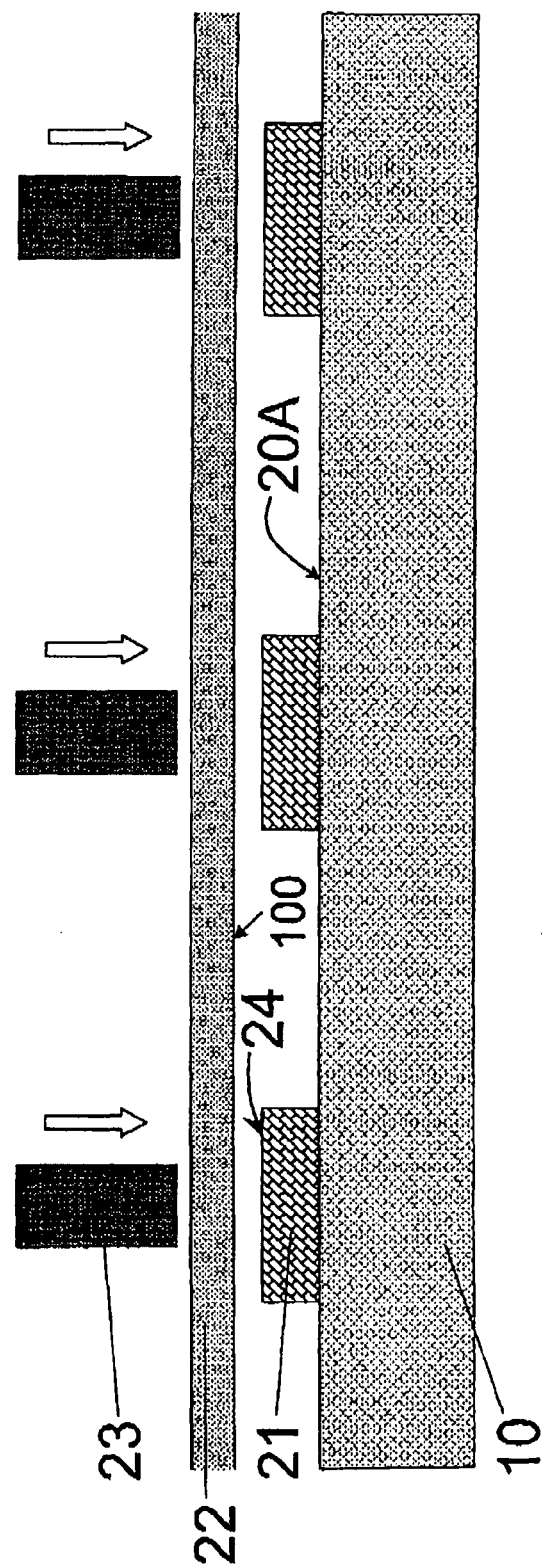
FIGS. 2B and 2BB show a step in the process of forming a finger pattern in accordance with the present invention.
Figure 2B:
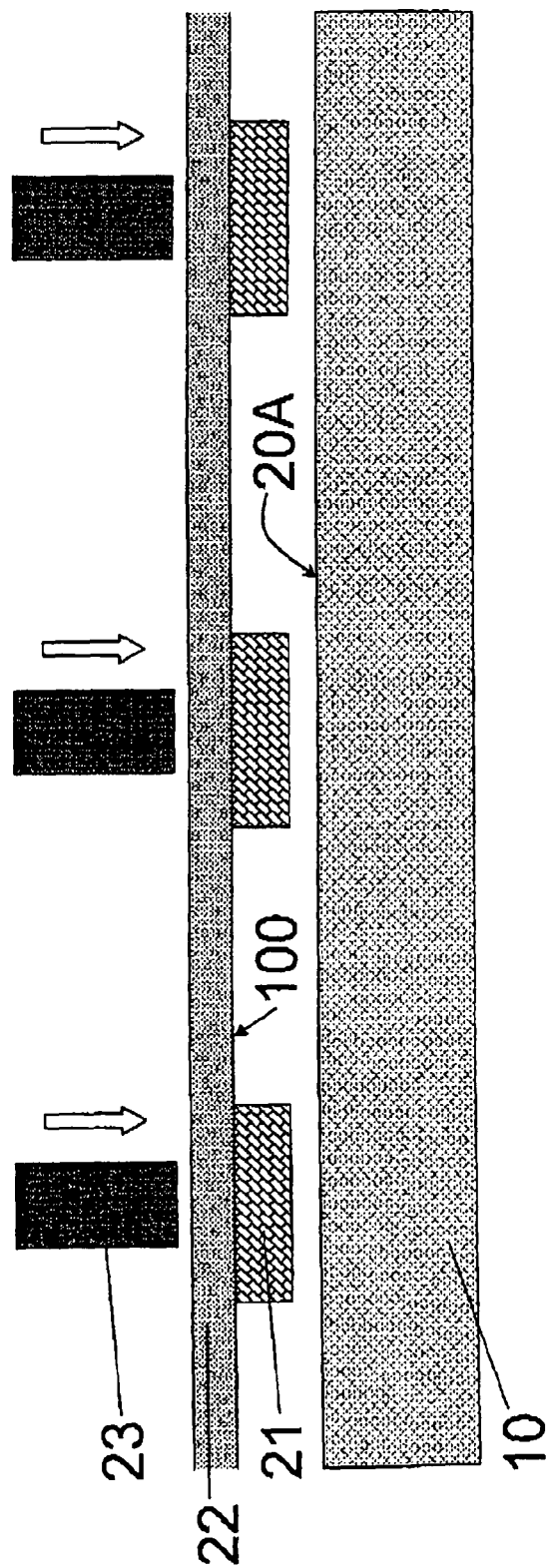

As shown in FIG. 2B, an embosser 23 is brought in close proximity of the free surface 24 of the already deposited transparent conductive material 21 and a metallic foil 22 is placed between the free surface 24 and the embosser 23. The embosser 23 has a pattern that is equivalent to the finger pattern to be formed. This pattern may be formed on the embosser using techniques such as masking and etching, dry etching etc. The embosser material is typically a thermally conductive material, which may be made of materials comprising nickel, magnesium, aluminum, copper, silicon, or the like. The embosser 23 may be pre-heated to a temperature which is typically less than 300° C., preferably in the range of 70-150° C. Referring to FIGS. 2B and 2C, the embosser 23 may be moved towards the device 10, pressing a portion of the metallic foil 22 against the free surface 24 of the transparent conductive material 21. It should be noted that the portion of the metallic foil 22 pushed against the free surface 24 of the transparent conductive material 21 is in the form of the finger pattern to be formed. Combination of the heat and the pressing action applied by the embosser 23 cuts the portion of the metallic foil 22 and adheres it to the free surface 24, thus forming a finger pattern 22A on the free surface 24 as the embosser is raised away from the device 20 (FIG. 2C). The unused portion 22B of the metallic foil may then be removed. It should be noted that the transparent conductive material may be deposited on the top surface 20A using a wet deposition technique such as ink writing, screen printing, roll printing, gravure printing etc. and it may be partially cured or un-cured at the time the portion of the metallic foil 22 is pushed against its free surface 24 by the embosser 23, which may be heated. This way adhesion of the finger pattern 22A to the free surface 24 may be improved.

The invention may also be practiced by providing an adhesive and conductive layer (not shown) on the bottom surface 100 of the metallic foil 22. This adhesive and conductive layer may cover substantially the whole of the bottom surface 100 or may be patterned so that it is present under the portion of the metallic foil that will later be transferred onto the top surface 20A. In this case there may not be a need for the formation of transparent conductive material 21 on the top surface 20A, and the metallic foil 22 with the adhesive and conductive layer on its bottom surface 100 may be pushed directly on the top surface 20A to form the finger pattern 22A as depicted in FIG. 2BB. The adhesive and conductive layer is preferably transparent to visible light but may also be opaque since its excess may remain attached to the unused portion 22B of the metallic foil 22 when the embosser pulls away from the device. Since the width of the adhesive and conductive layer would be nearly equivalent to the width of the fingers thus formed, the adhesive and conductive layer would not cause any shadow losses in this case.

Figure 2D:
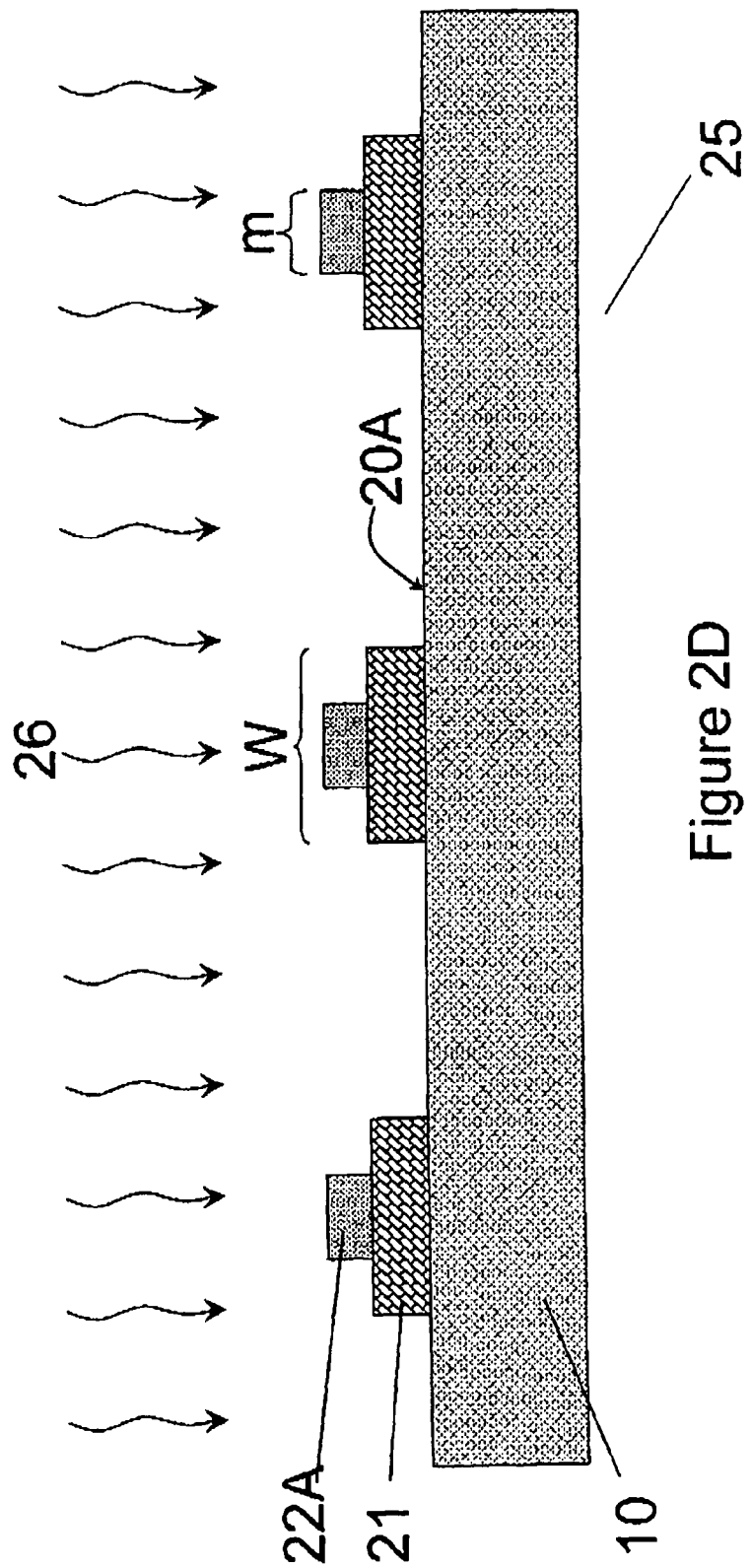
FIG. 2D shows a device structure with a finger pattern formed in accordance with the present invention.

FIG. 2D shows a cross-sectional view of an exemplary solar cell structure 25 fabricated using one of the embodiments of the present invention. The solar cell structure 25 comprises a device 10, such as a base/CIGS(S)/buffer layer/ZnO or base/p-CIGS(S)/n-CIGS(S)/ZnO stack with a top surface 20A, the top surface being the surface through which the light 26 will enter the solar cell. The top surface 20A comprises a conductive material such as doped ZnO, ITO, IZO or the like to carry the electricity generated by the solar cell to the locations where the finger pattern 22A is formed. Typical CIGS(S) type solar cells use a intrinsic-ZnO(50-200 nm thick)/doped-ZnO (200-1000 nm thick) structure over a buffer layer (such as CdS) to carry the current to the finger pattern. In the solar cell structure 25 of FIG. 2D, the width "W" of the transparent conductive material 21 may be greater than the width "m" of the fingers of the finger pattern 22A. As described above, screen printed fingers have a typical width of 100-200 µm. In the solar cell structure 25 of FIG. 2D, the width "m" of the fingers of the finger pattern 22A may be less than 100 µm, preferably in the range of 10-50 µm. Although the width "W" of the transparent conductive material 21 may be large this does not cause shadowing loss in the device because the transparent conductive material 21 transmits light to the device 10 efficiently. Furthermore since the conductivity of the metallic foil is much higher (typically 10-20 times higher) than that of screen printed silver material, narrow fingers may carry much higher currents without electrical loss.

Figure 2E:
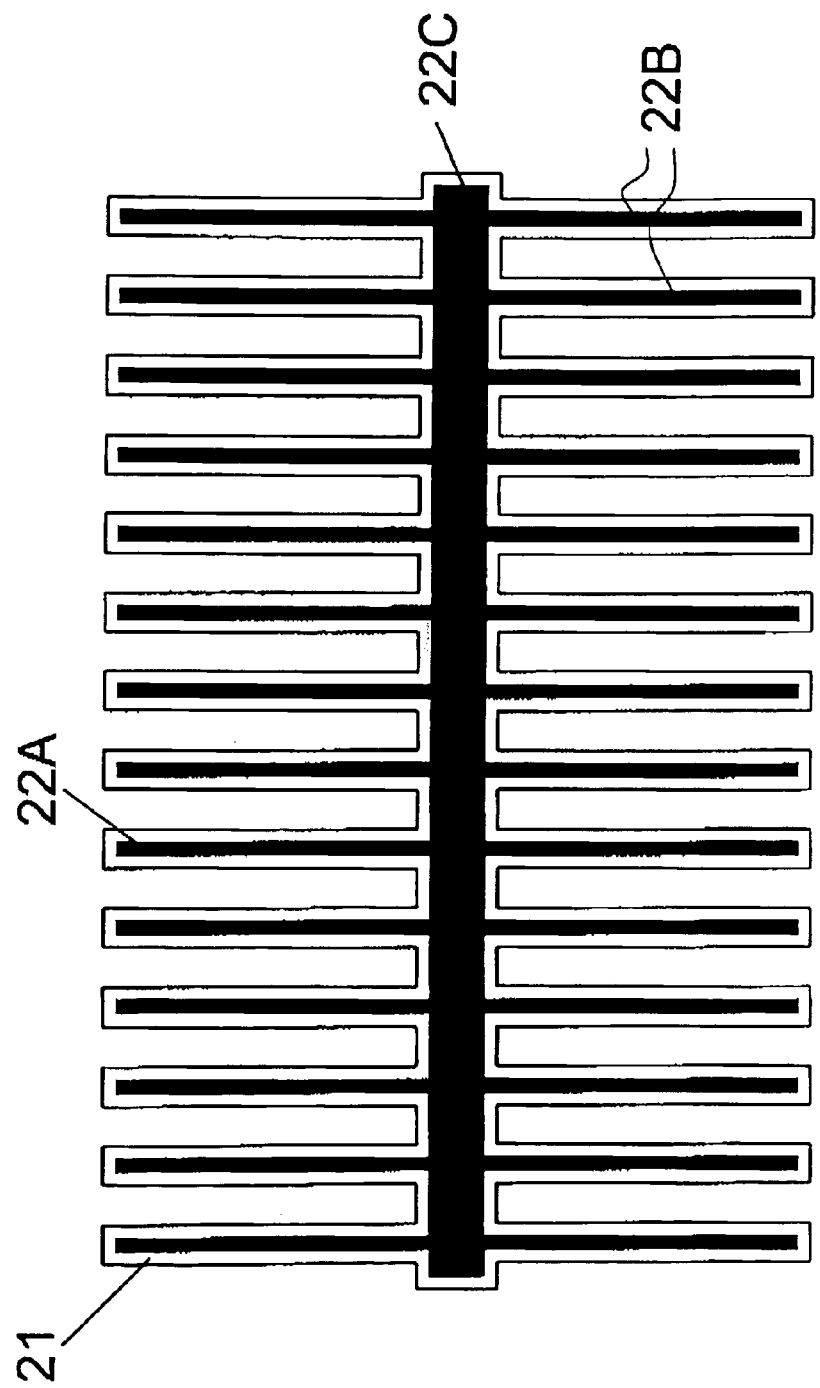
FIG. 2E shows a top view of the device structure of FIG. 2D.

FIG. 2E is a top view of the exemplary solar cell structure 25 of FIG. 2D. As can be seen from this figure the finger pattern 22A comprises fingers 22B and a busbar 22C and the transparent conductive material 21 is deposited in a way that it lies under the whole finger pattern 22A. Alternately, the transparent conductive material 21 may be formed under only the fingers 22B, but not under the busbar 22C.

The metallic foil 22 needs to be soft enough to be cut by the embosser 23 and should have conductivity of about less than one tenth of the transparent conductive material 21 preferably less than 5 µΩcm. The material make up of the foil may include but is not limited to Al, Cu, Ag, Au, W, Ni, Mo and their combinations thereof The metal foil thickness may be less than 100 µm, preferably in the range of 0.1-40 µm and more preferably in the range of 1-20 µm. The lower thickness values and finger width values may give rise to current levels inside the fingers that are close to the electro-migration limits and hence may need to be avoided. The electro-migration stability of the material can also be improved by the addition of dopants including Cu, Si, Ge to increase grain size of the Al and offer grain boundary adhesion protection.

The transparent conductive material 21 may consist of an organic base with conductive metal or metal oxide particles dispersed in it. The organic base may be epoxy, silicone, EVA, or other transparent materials that can stand the temperature requirements with minimal outgassing during the device encapsulation processes. Lower cure temperatures are preferred for example from room temperature to 150° C. range. Conductive particle materials include but not limited to, ITO, ZnO, SnO, ZnSnO, AlZnO, InZnO, CdSnO, GaZnO, carbon, carbon nanotubes, metallic nano rods etc. Preferably the opaque particles such as metallic particles are nano-structured to improve the conductivity maintaining a high open space between them and thus high transparency. This is accomplished since the particles crosslink to form closed loop structures with high conductivity while leaving open spaces that are transparent. Specifically in such cases a binder material is added on in a subsequent step to planarize the cross linked particles forming a level free surface 24 for subsequent processing and good adhesion to the metal foil 22. The width "W" of the transparent conductive material 21 may range from 1 mm down to 50 µm, preferably in the range of 75-400 µm. The thickness of the transparent conductive material 21 may be in the range of 5-10000 nm, preferably 50-1000 nm. The transparent conductive material 21 may be printed in one step or several steps using slot die printing, screen printing, gravure printing, flexographic printing, spin coating or other liquid coating processes.

Figure 3A:
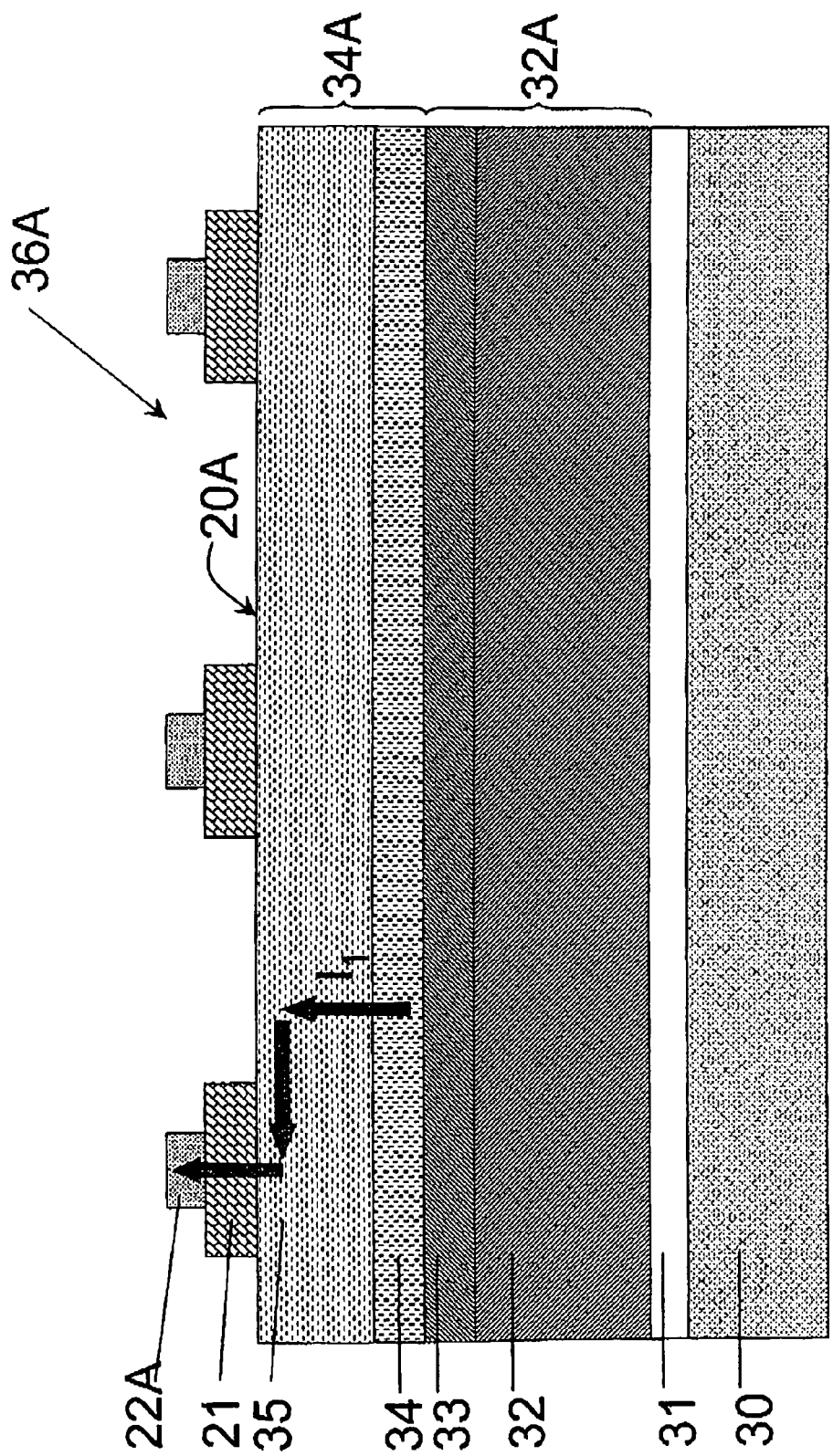
FIG. 3A shows a CIGS(S) solar cell structure in accordance with the present invention.

FIG. 3A shows a CIGS(S) solar cell 36 constructed in accordance with one embodiment of the present invention. The CIGS(S) solar cell comprises a substrate 30, a contact layer 31, a CIGS(S) absorber layer 32, and an optional buffer layer 33. A transparent layer 34A is formed on the buffer layer 33, the transparent layer comprising a high resistance layer 34 and a low resistance layer 35. The transparent conductive material 21 and the finger pattern 22A may be formed over the top surface 20A as described before. The high resistance layer 34 may be an un-doped ZnO layer with a resistivity value in the range of 1-1000 ohm-com, and the low resistance layer may be a doped ZnO layer such as an Al or In doped ZnO layer. This high/low resistivity layer structure is widely used in CIGS type solar cells since it reduces shunting effects in the device. In the CIGS(S) solar cell 36 of FIG. 3A, light generated current "I1" flows horizontally through the low resistivity layer 35 to the finger pattern 22A. The resistivity of the low resistance layer 35 may be in the range of about $4 \times 10^{-4} - 4 \times 10^{-3}$ ohm-cm in a typical solar cell. The function of the transparent layer 34A is to protect the active region 32A of the CIGS(S) solar cell 36 from any impurities, moisture etc. that may originate from the environment or the transparent conductive material 21, which may be a porous material. The transparent layer 34A being an inorganic layer with near 100% density is a good barrier to provide such protection.

Figure 3B:
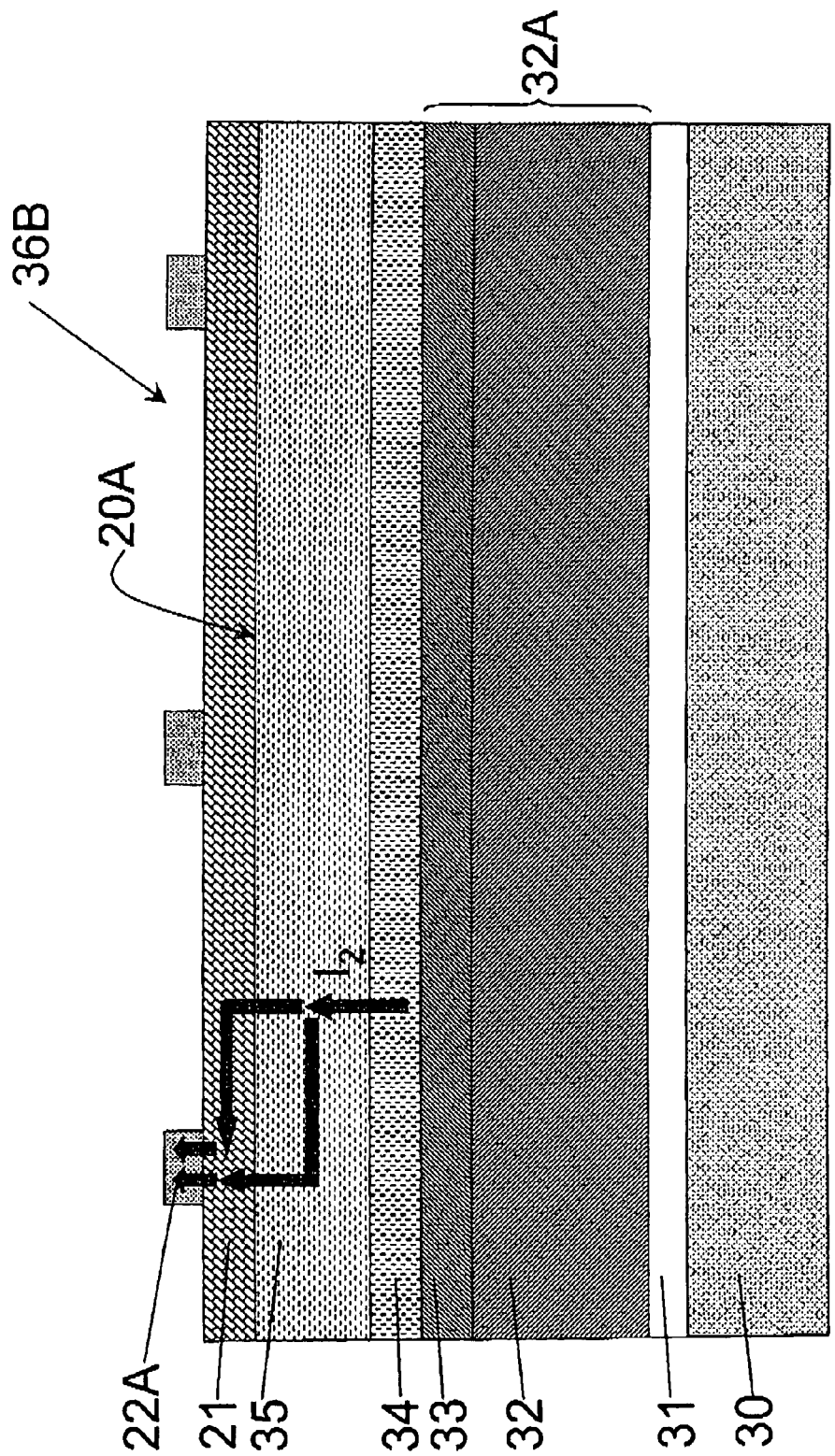
FIG. 3B shows another exemplary solar cell structure fabricated in accordance with the present invention.

FIG. 3B shows yet another device structure 36B. Various layers in the device structure 36B of FIG. 3B are similar to those in FIG. 3A and are numbered accordingly, same number representing the same layer. The difference in FIG. 3B is the fact that the transparent conductive material 21 covers substantially the whole of the top surface 20A. It should be noted that in the device structure 36B shown in FIG. 3B the thickness of the low resistance layer 35 may be reduced compared to FIG. 3A since the generated current "I2" may flow across the low resistance layer 35 as well as the transparent conductive material 21. For example, the thickness of the low resistance layer in FIG. 3A may be in the range of 200-1000 nm, whereas this thickness may be reduced to the range of 50-200 nm in the device structure 36B of FIG. 3B. This may lower manufacturing cost of solar cells since inorganic low resistance layers are typically deposited using expensive, low throughput sputtering techniques. Reduction of thickness requirement increases throughput of the sputtering technique and lowers cost.

Figure 3C:
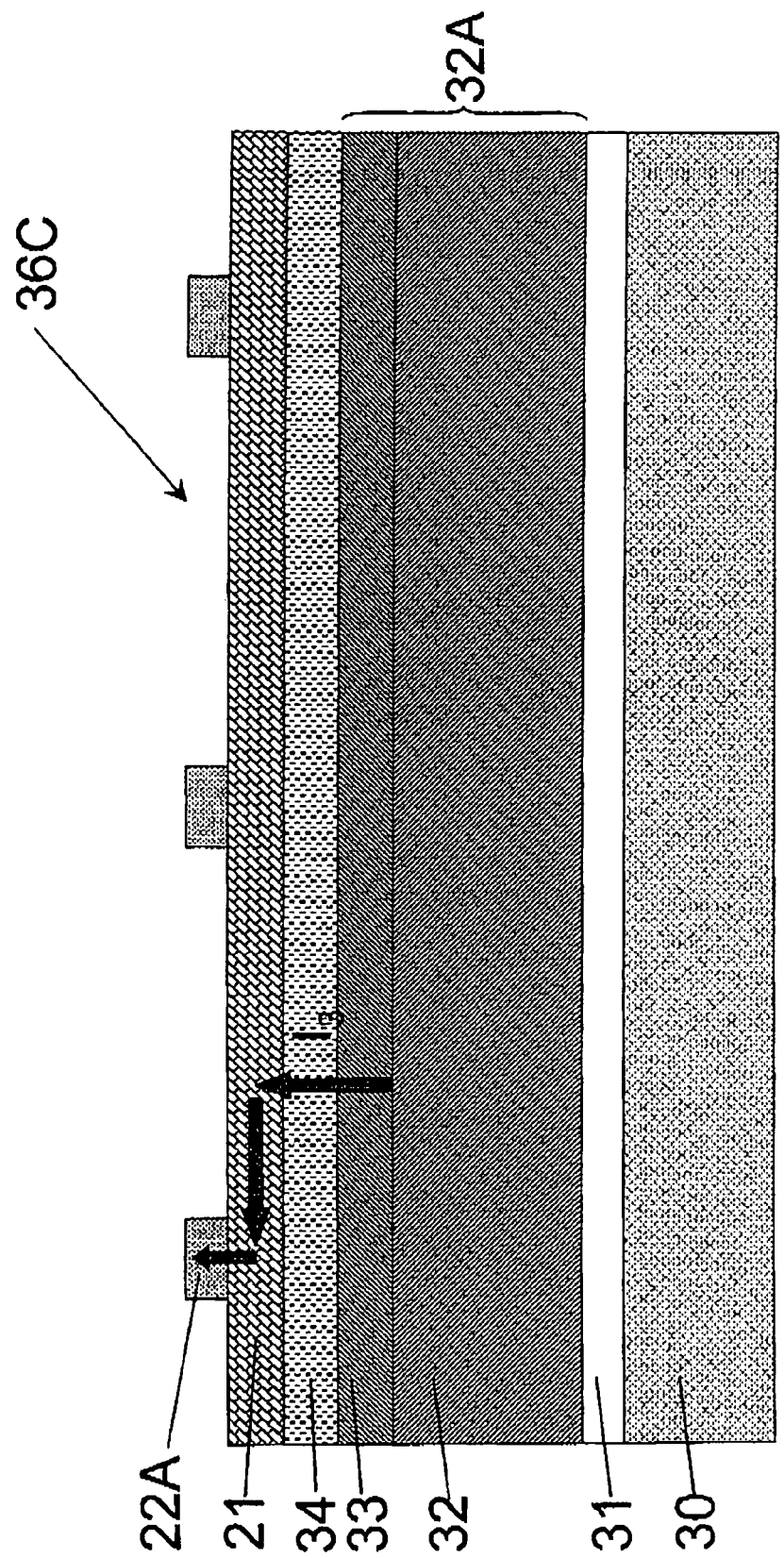
FIG. 3C is a solar cell structure where the active region of the cell is protected by a dense, transparent and high resistance inorganic layer and the conductivity is provided by a transparent conductive material.

In the cell 36C of FIG. 3C the high resistance layer 34 is used as a protective layer for the active region 32A of the cell and the transparent conductive material 21 is deposited over the high resistance layer 34. The current "I3" in this case flows mainly across the transparent conductive material 21 to reach the finger pattern 22A.

Figure 4:
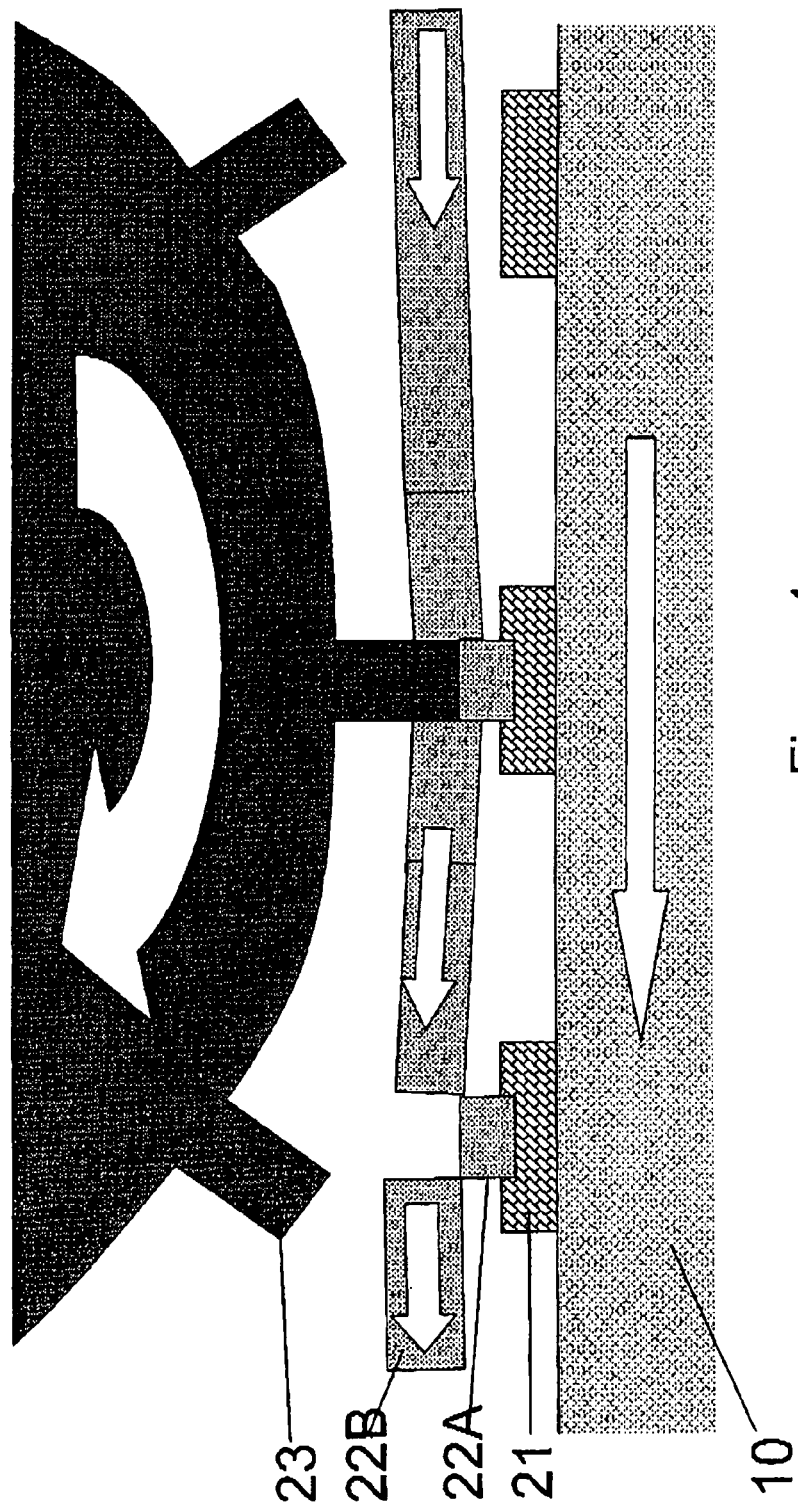
FIG. 4 shows a roll to roll method for transferring finger patterns on solar cell structures.

FIG. 4 shows a schematic of a roll-to-roll manufacturing technique using the embossing process described above using an embosser 23. The embosser 23 may be heated and the device 10 may be moved under the embosser 23 in a first direction while the embosser 23 also rotates. This way transfer of a finger pattern 22A over the device 10 is achieved.

Although the present invention is described with respect to certain preferred embodiments, modifications thereto will be apparent to those skilled in the art.

We claim:

1. A method of forming a metallic pattern corresponding to raised features of an embosser comprising:
    forming a transparent conductive layer having a pattern that matches the metallic pattern on a surface of a transparent top layer of a solar cell structure, the transparent conductive layer having an exposed surface, wherein the transparent conductive layer comprises an organic base with conductive particles comprising at least one of metallic particles and oxide particles dispersed into the organic base, and wherein the conductive particles comprises at least one of indium-tin-oxide, ZnO, SnO, ZnSnO, AlZnO, InZnO, CdSnO, GaZnO, and metallic nano rods, and wherein the step of forming includes the steps of:
        wet depositing a precursor layer; and
        partially curing the precursor layer to form the transparent conductive layer;
    placing a metallic foil in proximity to the exposed surface of the transparent conductive layer; and
    embossing the metallic pattern directly onto the exposed surface of the transparent conductive layer, the step of embossing including simultaneously applying pressure and heat to a portion of the metallic foil corresponding to the metallic pattern using the raised features of the embosser.

2. The method of claim 1 wherein the step of embossing includes:
    moving the raised features of the embosser to contact a first surface of the metallic foil;
    continuing to move the raised features of the embosser so that a second surface of the metallic foil opposite the first surface of the metallic foil contacts and adheres to the exposed surface of the transparent conductive layer; and
    removing those portions of the metallic foil that did not contact and adhere to the exposed surface of the transparent conductive layer.

3. The method of claim 1, wherein the transparent conductive layer has an average optical transmission of more than 70% within a wavelength range of 0.45-1.2 μm.

4. The method of claim 1, wherein the wet deposition technique comprises one of ink writing, spraying, screen printing, roll printing, gravure printing flexographic printing, and spin coating.

5. The method of claim 3, wherein the transparent top layer includes a low electrical resistivity layer with a resistivity value of less than about $4 \times 10^{-3}$ ohm-cm and a high electrical resistivity layer with a resistivity value of more than about 1 ohm-cm, and wherein the transparent conductive layer is deposited onto the low electrical resistivity layer.

6. The method of claim 1, wherein the embosser has a temperature range of less than 300° C. as the raised features of the embosser is pressed against the first surface of the metallic foil.

7. The method of claim 1, wherein the thickness of the metallic foil is in the range of 0.1-100 μm.

8. The method of claim 7, wherein the metallic foil comprises one of Al, Cu, Ag, Au, W, Ni and their alloys.

9. The method of claim 1 wherein the step of forming the transparent conductive layer occurs within a first process station on continuous portions of a continuously fed roll-to-roll solar cell structure;
    wherein the step of placing the metallic foil includes placing a new part of the metallic foil in proximity to each portion and subsequent portion of the exposed surface of the transparent conductive layer;
    wherein the step of embossing simultaneously applies, to each new part of the metallic foil and a corresponding portion and subsequent portion of the exposed surface of the transparent conductive layer, pressure and heat to the portion of the metallic foil corresponding to the metallic pattern using the raised features of the embosser; and
    further including the steps of holding and moving the continuously fed roll-to-roll solar cell structure through the first process station and the embosser station, wherein the portion and subsequent portions of the continuously fed roll-to-roll solar cell structure are unwrapped and fed from a supply roll, and embossed portions with attached metallic pattern are received and wrapped around a receiving roll.

* * * * *